United States Patent
Kristensen

(10) Patent No.: US 9,632,113 B2
(45) Date of Patent: Apr. 25, 2017

(54) FEW-MODED FIBER FOR SENSING CURRENT

(71) Applicant: OFS Fitel, LLC, Norcross, GA (US)

(72) Inventor: Poul Kristensen, Valby (DK)

(73) Assignee: OFS FITEL, LLC, Norcross, GA (US)

( * ) Notice: Subject to any disclaimer, the term of this patent is extended or adjusted under 35 U.S.C. 154(b) by 332 days.

(21) Appl. No.: 14/208,749

(22) Filed: Mar. 13, 2014

(65) Prior Publication Data
US 2015/0260763 A1    Sep. 17, 2015

(51) Int. Cl.
G02B 6/26 (2006.01)
G01R 15/24 (2006.01)
G01R 33/032 (2006.01)

(52) U.S. Cl.
CPC ....... *G01R 15/246* (2013.01); *G01R 33/0322* (2013.01)

(58) Field of Classification Search
CPC .................. G01R 15/246; G01R 33/0322
USPC .............................................. 385/12–13, 123
See application file for complete search history.

(56) References Cited

U.S. PATENT DOCUMENTS

| | | | | |
|---|---|---|---|---|
| 4,348,587 A * | 9/1982 | Tangonan | G01R 33/0327 | 250/227.14 |
| 4,697,146 A * | 9/1987 | Extance | G01R 33/0327 | 324/244.1 |
| 4,894,608 A * | 1/1990 | Ulmer, Jr. | G01R 33/0322 | 250/214 R |
| 4,949,038 A * | 8/1990 | Birch | C03B 37/027 | 250/227.17 |
| 5,051,577 A * | 9/1991 | Lutz | G01R 15/246 | 250/227.17 |
| 5,056,885 A * | 10/1991 | Chinn | G02F 1/3131 | 385/13 |
| 5,063,290 A * | 11/1991 | Kersey | G01R 15/246 | 250/227.17 |
| 5,136,235 A * | 8/1992 | Brandle | G01R 15/246 | 250/227.17 |
| 5,331,272 A * | 7/1994 | Parriaux | G01R 15/246 | 324/117 R |
| 5,463,312 A * | 10/1995 | Lutz | G01R 33/032 | 324/762.09 |
| 6,023,331 A * | 2/2000 | Blake | G01R 15/246 | 250/227.27 |
| 6,114,846 A * | 9/2000 | Bosselmann | G01R 15/246 | 324/244.1 |
| 6,140,634 A * | 10/2000 | Bosselmann | G01R 15/247 | 250/225 |
| 6,301,400 B1 * | 10/2001 | Sanders | G01R 15/246 | 250/227.14 |
| 6,320,366 B1 * | 11/2001 | Borrelli | C03C 13/042 | 324/96 |
| 6,504,355 B2 * | 1/2003 | Minier | G01R 15/246 | 324/175 |
| 6,707,558 B2 * | 3/2004 | Bennett | G01R 15/246 | 356/465 |
| 6,891,622 B2 * | 5/2005 | Dyott | G01R 15/246 | 356/483 |
| 7,450,792 B2 * | 11/2008 | Bohnert | G01R 15/247 | 385/12 |
| 8,320,719 B2 * | 11/2012 | Wueest | G01R 3/00 | 324/95 |
| 8,655,115 B2 * | 2/2014 | Oh | G01R 15/246 | 385/1 |
| 2003/0223074 A1 * | 12/2003 | Chen | G01D 5/35332 | 356/477 |
| 2005/0088662 A1 * | 4/2005 | Bohnert | G01R 33/032 | 356/483 |
| 2011/0072858 A1 * | 3/2011 | Wueest | G01R 3/00 | 65/485 |
| 2012/0121216 A1 * | 5/2012 | Oh | G01R 15/246 | 385/1 |
| 2012/0283969 A1 * | 11/2012 | Bohnert | G01R 15/246 | 702/64 |
| 2013/0033267 A1 * | 2/2013 | Harlev | G01R 1/071 | 324/501 |
| 2013/0195395 A1 * | 8/2013 | Huang | G02B 6/2766 | 385/11 |

* cited by examiner

*Primary Examiner* — Thomas A Hollweg
*Assistant Examiner* — Guy Anderson
(74) *Attorney, Agent, or Firm* — Sam S. Han, Esq.

(57) ABSTRACT

A few-moded fiber is doped such that spatial modes of a signal exhibit different magnetic-field-dependent effects. Based on these magnetic-field-dependent effects, one can determine the electric current that induced a magnetic field that caused these effects.

15 Claims, No Drawings

FEW-MODED FIBER FOR SENSING CURRENT

BACKGROUND

Field of the Disclosure

The present disclosure relates generally to sensors and, more particularly, to fiber-optic sensors.

Description of Related Art

Determining an amount of current being delivered to a load can be useful for many applications. For example, supply current can be monitored to understand a system's impact on battery life, load current can be monitored for safety-critical decisions in protection circuits, current magnitude and direction can provide an understanding of system subcomponent performance, and so on. Consequently, there are ongoing efforts related to current sensors.

SUMMARY

The present disclosure provides systems and methods for sensing current. Briefly described, one embodiment comprises a few-moded fiber which is doped such that spatial modes of a signal exhibit different magnetic-field-dependent effects.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims.

DETAILED DESCRIPTION OF THE EMBODIMENTS

According to Ampere's law, an electric current generates a magnetic field that is proportional to the electric current. More specifically, according to Maxwell's equations, when a current flows through a conductor, it induces a magnetic field that is perpendicular to the conductor. For some materials, like quartz, the Faraday effect causes a circular birefringence, which can be exploited to sense current. In particular, these current sensors are based on the effect that the induced birefringence has on a degree of polarization of light that is propagating parallel to the direction of the magnetic field lines. The rotation of the polarization can be measured by using a polarizing element (e.g., optics polarizer, polarizing fiber, etc.), or by causing an interference between the rotated field and a reference field and measuring the interference.

The present disclosure seeks to exploit these magneto-optical properties to measure current. Specifically, for some embodiments, a few-moded fiber is doped so that different spatial modes of a signal exhibit different magnetic-field-dependent effects. Thus, in the presence of current-induced magnetic field, the magnetic-field-dependent effects on the different spatial modes can be determined. And, the electrical current can be calculated from these magnetic-field-dependent effects.

With this in mind, reference is now made in detail to the description of the embodiments. While several embodiments are described, there is no intent to limit the disclosure to the embodiment or embodiments disclosed herein. On the contrary, the intent is to cover all alternatives, modifications, and equivalents.

Broadly, one embodiment of the invention is a system comprising a few-moded fiber with a doped region. One end of the few-moded fiber is spliced to an input fiber (e.g., a single-moded fiber), while the other end of the few-moded fiber is spliced to an output fiber (e.g., another single-moded fiber). The few-moded fiber is configured to propagate a signal that has multiple spatial modes. For simplicity, this is illustrated herein using a two-moded fiber that carries two spatial modes (a first spatial mode and a second spatial mode). The few-moded fiber is doped such that each of the spatial modes exhibits a different magnetic-field-dependent birefringence. So, for the two-moded fiber, the first spatial mode will experience a magnetic-field-dependent birefringence that is different from the second spatial mode. As explained above, the magnetic-field-dependent birefringence is a circular birefringence ($\beta_{Circular}$).

When there is a bend in the few-moded fiber, the bend induces a linear birefringence ($\beta_{Linear}$) in the few-moded fiber, where $\beta_{Linear}$ is perpendicular to $\beta_{Circular}$. In other words, the bend-induced birefringence is perpendicular to the magnetic-field-induced birefringence. The total birefringence ($\beta$) that the few-moded fiber exhibits is:

$$\beta = \sqrt{\beta_{Linear}^2 + \beta_{Circular}^2} \qquad [\text{Eq. 1}].$$

If the linear, bend-induced birefringence is greater than the circular, magnetic-field-induced birefringence, then the total birefringence can be approximated according to:

$$\beta \approx \beta_{Linear} + \frac{\beta_{Circular}^2}{\beta_{Linear}} \qquad [\text{Eq. 2}].$$

Shown from Eqs. 1 and 2, the linear, bend-induced birefringence is affected as a function of the circular, magnetic-field-induced birefringence.

As shown above, the few-moded fiber for current sensing can greatly simplify design of an all-optical current sensing device. Furthermore, given the known relationship between a current and its induced magnetic field, this type of few-moded fiber produces a high-accuracy measurement of current based on measurable birefringence. Additionally, this type of few-moded fiber-based sensor reduces complexity and, consequently, system-level costs. The reduced complexity also results in greater reliability. It should also be appreciated that this type of few-moded fiber-based sensor provides a mechanism for measuring currents in electrical conductors without completely encircling the electrical conductor. As such, this type of few-moded fiber for sensing current can be employed in numerous contexts, such as, for example, industrial applications, energy-related applications, medicine, transportation, aerospace-related applications, defense-related applications, government laboratories, telecommunications environments, and fiber lasers, to name a few.

Although exemplary embodiments have been shown and described, it will be clear to those of ordinary skill in the art that a number of changes, modifications, or alterations to the disclosure as described may be made. All such changes, modifications, and alterations should therefore be seen as within the scope of the disclosure.

What is claimed is:

1. A system, comprising:
a first single-moded fiber;
a few-moded fiber comprising an input end, the few-moded fiber further comprising an output end, the input end being spliced to the first single-moded fiber, the few-moded fiber to propagate an optical signal, the optical signal comprising a first spatial mode, the optical signal further comprising a second spatial mode, the first spatial mode exhibiting a first magnetic-field-dependent birefringence, the second spatial mode exhibiting a second magnetic-field-dependent birefringence, the second magnetic-field-dependent birefringence being different from the first magnetic-field-dependent birefringence; and a second single-moded fiber spliced to the output end of the few-moded fiber.

2. The system of claim 1, the few-moded fiber being a two-moded doped fiber.

3. The system of claim 1, the few-moded fiber comprising a bend.

4. The system of claim 3, the bend inducing a linear birefringence ($\beta_{Linear}$) in the few-moded fiber.

5. The system of claim 4, the few-moded fiber exhibiting a circular birefringence ($\beta_{Circular}$), the $\beta_{Circular}$ being induced by a magnetic field.

6. The system of claim 5, the few-moded fiber exhibiting a total birefringence ($\beta$), such that:

$$\beta = \sqrt{\beta_{Linear}^2 + \beta_{Circular}^2}.$$

7. The system of claim 5, the few-moded fiber exhibiting a total birefringence ($\beta$), such that:

$$\beta \approx \beta_{Linear} + \frac{\beta_{Circular}^2}{\beta_{Linear}}.$$

8. A system, comprising:
a few-moded fiber; and
a doped region within the few-moded fiber, the doped region to propagate a signal having a first spatial mode and a second spatial mode, the first spatial mode exhibiting a first magnetic-field-dependent birefringence, the second spatial mode exhibiting a second magnetic-field-dependent birefringence, the first magnetic-field-dependent birefringence being different from the second magnetic-field dependent birefringence.

9. The system of claim 8, further comprising an input fiber spliced to the few-moded fiber.

10. The system of claim 8, further comprising an output fiber spliced to the few-moded fiber.

11. The system of claim 8, the few-moded fiber being a two-moded fiber.

12. The system of claim 8, the few-moded fiber comprising a bend.

13. The system of claim 12, the few-moded fiber exhibiting a circular birefringence ($\beta_{Circular}$), the $\beta_{Circular}$ being induced by a magnetic field.

14. The system of claim 13, the few-moded fiber exhibiting a total birefringence ($\beta$), such that:

$$\beta = \sqrt{\beta_{Linear}^2 + \beta_{Circular}^2},$$

where $\beta_{Linear}$ represents a linear birefringence.

15. The system of claim 13, the few-moded fiber exhibiting a total birefringence ($\beta$), such that:

$$\beta \approx \beta_{Linear} + \frac{\beta_{Circular}^2}{\beta_{Linear}},$$

where $\beta_{Linear}$ represents a linear birefringence.

* * * * *